US007666715B2

(12) United States Patent
Brunner et al.

(10) Patent No.: US 7,666,715 B2
(45) Date of Patent: Feb. 23, 2010

(54) RADIATION-EMITTING AND/OR RADIATION-RECEIVING SEMICONDUCTOR COMPONENT AND METHOD FOR THE PRODUCTION THEREOF

(75) Inventors: Herbert Brunner, Sinzing (DE); Harald Jäger, Regensburg (DE); Jörg Erich Sorg, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/578,854

(22) PCT Filed: Dec. 14, 2004

(86) PCT No.: PCT/DE2004/002738

§ 371 (c)(1),
(2), (4) Date: May 11, 2006

(87) PCT Pub. No.: WO2005/064696

PCT Pub. Date: Jul. 14, 2005

(65) Prior Publication Data

US 2007/0131957 A1    Jun. 14, 2007

(30) Foreign Application Priority Data

Dec. 30, 2003  (DE) .................... 103 61 801
Apr. 2, 2004   (DE) .............. 20 2004 005 228 U

(51) Int. Cl.
   *H01L 23/31*   (2006.01)
(52) U.S. Cl. .............. 438/124; 257/100; 257/E33.059; 257/E23.12
(58) Field of Classification Search .......... 257/100, 257/E23.12, E23.121; 438/124, 126, 127
See application file for complete search history.

(56) References Cited

U.S. PATENT DOCUMENTS

| 3,531,856 | A |   | 10/1970 | Bell et al. |
| 3,971,747 | A | * | 7/1976  | Bank et al. .................. 523/435 |
| 5,147,982 | A | * | 9/1992  | Steffen ....................... 174/521 |
| 5,648,687 | A |   | 7/1997  | Matsuo et al. |
| 6,066,861 | A |   | 5/2000  | Höhn et al. |

(Continued)

FOREIGN PATENT DOCUMENTS

CN    1316103    10/2001

(Continued)

OTHER PUBLICATIONS

Authorized officer: van der Linden, *International Search Report*, PCT/DE2004/002738, 2005.

(Continued)

*Primary Examiner*—Minh-Loan T Tran
*Assistant Examiner*—W. Wendy Kuo
(74) *Attorney, Agent, or Firm*—Fish & Richardson P.C.

(57) ABSTRACT

A radiation-emitting and/or radiation-receiving semiconductor component comprising a radiation-emitting and/or radiation-receiving semiconductor chip, a molded plastic part which is transparent to an electromagnetic radiation to be emitted and/or received by the semiconductor component and by which the semiconductor chip is at least partially overmolded, and external electrical leads that are electrically connected to electrical contact areas of the semiconductor chip. The molded plastic part is made of a reaction-curing silicone molding compound. A method of making such a semiconductor component is also specified.

8 Claims, 2 Drawing Sheets

U.S. PATENT DOCUMENTS

| | | | |
|---|---|---|---|
| 6,088,901 A * | 7/2000 | Huber et al. | 29/469.5 |
| 6,144,107 A * | 11/2000 | Narita | 257/789 |
| 6,274,890 B1 * | 8/2001 | Oshio et al. | 257/98 |
| 6,274,924 B1 | 8/2001 | Carey et al. | |
| 6,376,902 B1 | 4/2002 | Arndt | |
| 6,489,637 B1 * | 12/2002 | Sakamoto et al. | 257/98 |
| 6,521,916 B2 | 2/2003 | Roberts et al. | 257/100 |
| 6,717,256 B1 | 4/2004 | Suzuki et al. | |
| 6,930,332 B2 * | 8/2005 | Hashimoto et al. | 257/98 |
| 6,936,855 B1 * | 8/2005 | Harrah | 257/88 |
| 7,176,623 B2 | 2/2007 | Nitta et al. | |
| 2002/0180351 A1 * | 12/2002 | McNulty et al. | 313/512 |
| 2002/0195935 A1 | 12/2002 | Jager et al. | |
| 2005/0062140 A1 * | 3/2005 | Leung et al. | 257/678 |

FOREIGN PATENT DOCUMENTS

| | | |
|---|---|---|
| CN | 1380703 | 11/2002 |
| DE | 102 14119 | 10/2003 |
| EP | 1 193772 | 4/2002 |
| EP | 1 249873 | 10/2002 |
| EP | 1 267423 | 12/2002 |
| GB | 2 104 827 | 3/1983 |
| JP | 59107584 | 6/1984 |
| JP | 04111366 | 4/1992 |
| JP | 05327028 | 12/1993 |
| JP | 08298345 | 11/1996 |
| JP | 08335719 | 12/1996 |
| JP | 08335719 A * | 12/1996 |
| JP | 2003051618 | 2/2003 |
| WO | WO 98/12757 | 3/1998 |
| WO | WO 99/07023 | 2/1999 |
| WO | WO 01/50540 | 7/2001 |

OTHER PUBLICATIONS

Office Action Chinese Patent Application No. 200480032007.6 dated Sep. 14, 2007.

European Search Report for Application No. 04 802 941.7—1235 dated Dec. 19, 2008.

* cited by examiner

US 7,666,715 B2

RADIATION-EMITTING AND/OR RADIATION-RECEIVING SEMICONDUCTOR COMPONENT AND METHOD FOR THE PRODUCTION THEREOF

CROSS-REFERENCE TO RELATED APPLICATIONS

This application is the National Stage of International Application No. PCT/DE2004/002738, filed on Dec. 14, 2004, which claims the priority to German Patent Applications Ser. No. 103 61801.5, filed on Dec. 30, 2003, and Ser. No. 20 2004005228.8, filed on Apr. 2, 2004. The contents of the prior applications are hereby incorporated by reference in their entireties.

FIELD OF THE INVENTION

The invention relates to a radiation-emitting and/or radiation-receiving semiconductor component comprising a radiation-emitting and/or radiation-receiving semiconductor chip, a molded plastic part which is transparent to an electromagnetic radiation to be emitted and/or received by the semiconductor component and by which the semiconductor chip is at least partially overmolded, and external electrical leads that are electrically connected to electrical contact areas of the semiconductor chip.

BACKGROUND OF THE INVENTION

Such semiconductor components are known for example from WO 01/50540. In the component described in that document, a semiconductor chip is mounted on a leadframe. The semiconductor chip and subregions of the leadframe are encapsulated by a transfer-molded plastic body. External electrical leads of the leadframe protrude from the molded plastic body. The molded plastic body is made for example of an epoxy resin and may contain an inorganic or organic conversion agent as well as fillers.

Another type of optoelectronic component is described for example in WO 99/07023. In that case, a leadframe with the semiconductor chip on it is overmolded by a housing base body comprising a reflector-type recess. The semiconductor chip is disposed in the recess. After the semiconductor chip has been mounted, the recess is filled with a radiation-transparent or, frequently, transparent potting compound at least to a sufficient extent to encapsulate the semiconductor chip and any bonding wires from the chip to the leadframe. A known potting compound for such types of construction is, for example, transparent epoxy casting resin. Similar constructions are known for example from WO 98/12757.

U.S. Pat. No. 6,274,924 B1 describes a surface-mountable LED package wherein a rigid plastic body in which the semiconductor chip is disposed and electrically connected to external electrical leads of a leadframe is filled with a soft, radiation-transparent encapsulant, for example silicone. A lens cap is placed on the plastic body. This lens cap on the one hand gives the encapsulant a defined shape, and on the other hand keeps it from leaking out of the housing base body. Due to the comparatively large number of package components, this type of LED package requires comparatively high production expenditure.

SUMMARY OF THE INVENTION

The object of the present invention is to improve a semiconductor component of the type cited at the beginning hereof in such fashion that it is technically easy to make and is sufficiently resistant to ageing, particularly when used with blue-light- or UV-radiation-emitting semiconductor chips.

A radiation-emitting and/or radiation-receiving semiconductor component according to the invention includes the following elements:
a radiation-emitting and/or radiation-receiving semiconductor chip,
a particularly injection-molded or transfer-molded plastic body, which is transparent to an electromagnetic radiation to be emitted and/or received by the semiconductor component, by which the semiconductor chip is at least partially overmolded, and which is made from a reaction-curing silicone molding compound, and
external electrical leads that are electrically connected to electrical contact areas of the semiconductor chip.

In the present context, the term "silicone molding compound" encompasses not only molding compounds composed entirely of silicone, but also such molding compounds that can be processed into molded plastic parts via a molding process and are composed of silicone in a proportion such that the resistance to ageing of the molding compound is sufficiently improved over that of conventional molding compounds.

The silicone molding compound preferably has a curing time of 10 minutes or less. This advantageously simplifies the production of the semiconductor components while yielding economically viable machine cycle times.

The silicone molding compound preferably has a hardness when cured of 65 Shore D or more. This advantageously improves the shape stability of the plastic molded part against mechanical influences.

The molding compound is also preferably a silicone composite material that contains at least one other material in addition to silicone, such as epoxy resin, for example. Such composite materials offer the advantage of being adaptable to the requirements of the application in question and the process being used. For example, silicone/epoxy resin composites ordinarily cure faster than pure silicone molding compounds and have higher mechanical strength. For this reason, they are usually easier to unmold and shorter process times are possible.

To produce mixed-light-emitting semiconductor components, the silicone molding compound contains conversion material that absorbs at least a portion of an electromagnetic radiation of a first wavelength range emitted by the semiconductor chip and/or received by the semiconductor component and emits electromagnetic radiation in a second wavelength range that is different from the first wavelength range. Inorganic phosphor powders, in particular, can easily be mixed into silicone material. Examples hereof are cerium-doped yttrium aluminum garnet powder and cerium-doped terbium aluminum garnet powder. Other suitable inorganic phosphors are listed for example in the documents WO 01/50540 A1 and WO 98/12757 A1, whose disclosure content in this regard is hereby incorporated by reference.

A molded plastic part according to the invention is preferably used in semiconductor components with semiconductor chips that emit electromagnetic radiation in the blue or ultraviolet region of the spectrum.

In a preferred embodiment, the semiconductor component is produced from a single, one-piece molded plastic part made from reaction-curing silicone molding compound. A basic principle of such a molded plastic part is described for example in the document WO 01/50540, whose disclosure content in this regard is hereby incorporated by reference.

In another preferred embodiment, the semiconductor chip is mounted on a carrier substrate or carrier sheet provided with electrical conduction paths for electrically connecting the semiconductor chip, and the semiconductor chip is encapsulated by a molded plastic part made from reaction-curing silicone casting compound.

In a preferred method of making a semiconductor component according to the invention, the semiconductor chip is attached to a leadframe provided with the external electrical leads and is electrically connected to said external electrical leads. The semiconductor chip, including subregions of the leadframe, is then overmolded with a silicone molding compound via an injection molding process or a transfer molding process.

In another preferred method, a semiconductor chip is disposed on a carrier substrate or a carrier sheet provided with electrical conduction paths for electrically connecting the semiconductor chip and is electrically connected to said electrical conduction paths. The semiconductor chip on the carrier substrate or carrier sheet is then encapsulated with a silicone molding compound via an injection molding process or a transfer molding process.

Particularly preferably, the invention finds application in radiation-emitting and/or radiation-receiving semiconductor components with a footprint of approximately 0.5 mm×1.0 mm or less and/or with a total component height of only 350 µm or less, preferably 250 µm or less.

BRIEF DESCRIPTION OF THE DRAWINGS

Further advantages, improvements and advantageous embodiments will become apparent from the exemplary embodiments described hereinbelow in conjunction with FIGS. 1 to 3. Therein.

Figure 1:
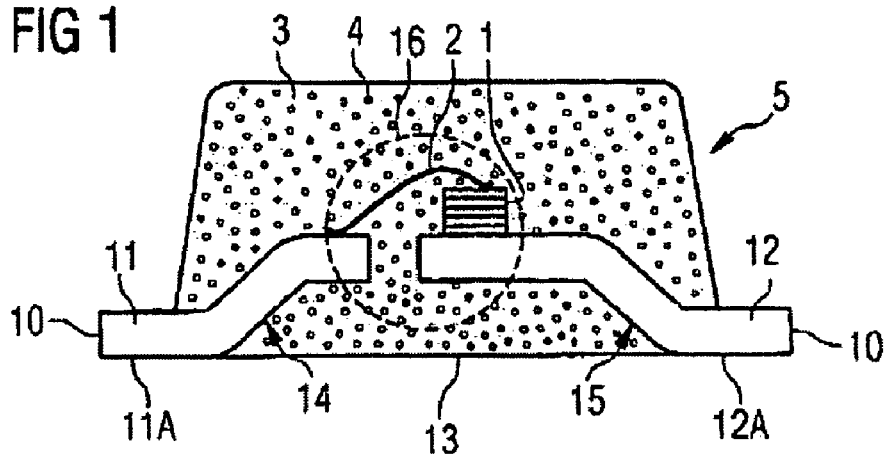
FIG. 1 is a schematic representation of a section through a first exemplary embodiment.

In the various exemplary embodiments, like or like-acting elements are identified in the same respective manner and are provided with the same reference numerals. The figures are basically not to be considered true to scale, nor are the individual elements essentially depicted in their actual dimensional relationships to one another.

DETAILED DESCRIPTION OF THE PREFERRED EMBODIMENTS

The first exemplary embodiment, illustrated in FIG. 1, is in the form of a leadframe-based, white-light-emitting light-emitting diode component.

A metallic leadframe 10, on which an LED chip 1 is mounted in a chip mounting region 16, is overmolded with a transparent silicone molding compound 3, from which a leadframe lead 11, 12 protrudes at each of two opposite lateral faces. Leadframe leads 11, 12 constitute the external electrical leads of the LED component. Inside the transparent silicone molding compound 3, each leadframe lead 11, 12 is provided with an S-shaped bend 14, 15 from a chip mounting region 16 to a mounting side 13 of the LED component.

To increase the refractive index, the silicone molding compound 3 can be admixed with at least one inorganic filler such as $TiO_2$, $ZrO_2$ or $\alpha$-$Al_2O_3$.

In the method of making an LED light source according to FIG. 1, LED chip 1 is mounted on leadframe 10 in chip mounting region 16 and is connected electrically conductively to leadframe leads 11, 12. Leadframe leads 11, 12 are provided with S-type bends 14, 15 before or after the mounting of semiconductor LED chip 1. The semiconductor LED chip 1, including the S-type bends 14, 15 of leadframe 10, is overmolded with a transparent silicone molding compound 3 via a transfer molding or injection molding process. The silicone molding compound 3 is then at least partially cured in the transfer or injection mold to form a sufficiently shape-stable, one-piece molded plastic part 5.

In the case of a white light source, the semiconductor LED 1 has an emission spectrum in the ultraviolet or blue region of the spectrum. The semiconductor LED chip is preferably GaN— or InGaN-based. Alternatively, however, it can also be composed of the material system ZnS/ZnSe or any other material system suitable for that region of the spectrum.

Once the semiconductor LED chip 1 has been applied and contacted, a transparent silicone molding compound 3 is injected onto leadframe leads 11 and 12 in a suitable injection molding or transfer molding apparatus. Embedded in silicone molding compound 3 are phosphor particles 4 composed of a conversion material that brings about an at least partial wavelength conversion of the electromagnetic radiation emitted by semiconductor LED chip 1. This wavelength conversion results in an emission spectrum that gives the optical impression of a white light source. A suitable phosphor for the phosphor particles is for example cerium-doped yttrium aluminum garnet powder or cerium-doped terbium aluminum garnet powder.

The prefabrication of the leadframe 10 and the overmolding with silicone molding compound 3, which contains any phosphor particles 4 and additional fillers that are used, is performed such that leadframe segments 11 and 12 are led horizontally out of molded plastic part 5, specifically such that their solder connection areas 11A and 12A lie substantially in the same plane as the back side of molded plastic part 5, which is usually the face by which the component is mounted on a circuit board. To accomplish this, leadframe leads 11 and 12 are already bent into their final shape prior to potting. They therefore already trace the S-type bends in their course from the chip connection region to the mounting area before overmolding takes place, so that no further bending stress is exerted on the component after overmolding. This is especially advantageous in the case of highly miniaturized components with small-volume molded plastic parts 5, since with this particular type of component, in the event of delamination between the potting compound and the leadframe, elicited for example by bending stress, there is a very great risk that the finished component will not be hermetically sealed.

The silicone molding compound 3 has for example a curing time of 10 minutes or less and a hardness when cured of 65 Shore D or more.

The finished component can advantageously be soldered to a printed circuit board (card) at flat, horizontal contact areas 11A and 12A in a reflow process. A component suitable for SMT (Surface Mounting Technology) is thereby produced.

A photodiode component detecting UV or blue radiation can be configured in the same manner.

Figure 2:
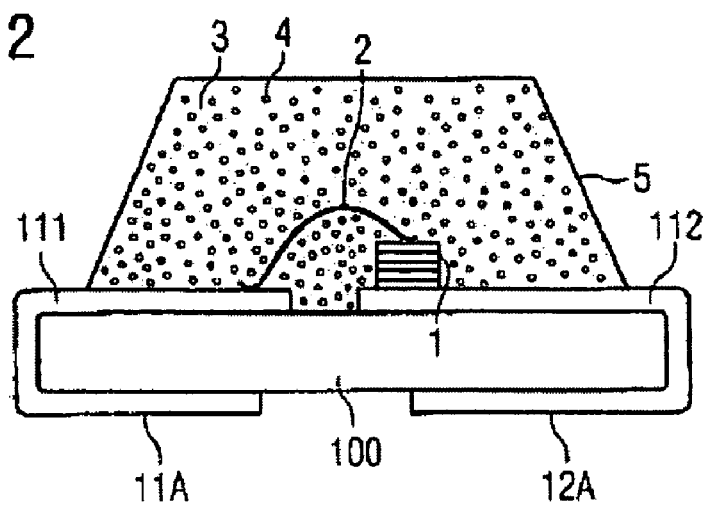
FIG. 2 is a schematic representation of a section through a second exemplary embodiment.

The second exemplary embodiment, illustrated in FIG. 2, differs from the first exemplary embodiment, that of FIG. 1, chiefly in that an electrically insulating carrier substrate 100 with electrical conduction paths 111, 112 in the form of metallization layers is provided instead of the leadframe 10. Molded plastic part 5 is disposed on carrier substrate 100. This component can be made in an analogous manner to the first exemplary embodiment.

Figure 3:
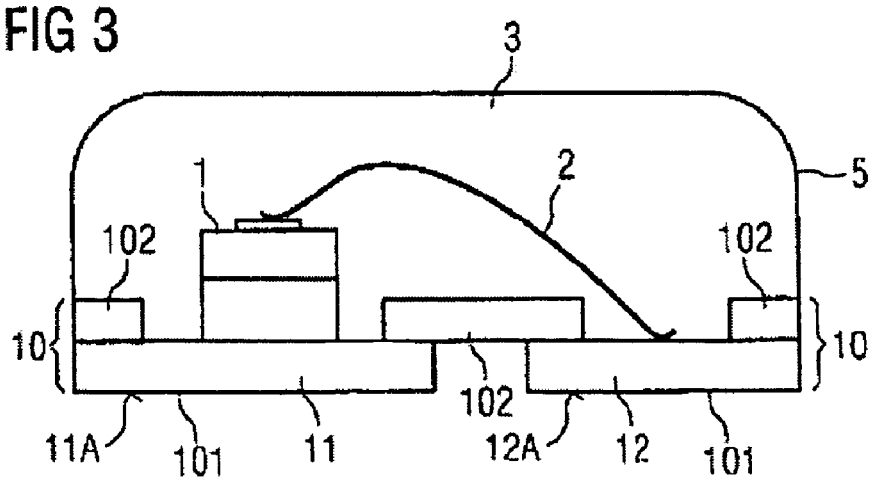
FIG. 3 is a schematic representation of a section through a third exemplary embodiment.

The third exemplary embodiment, illustrated in FIG. 3, is a miniature light-emitting diode comprising a flexible leadframe 10, an LED chip 1 with an active, radiation-emitting region, and a molded plastic part 5. Said flexible leadframe 10 is made of 60 µm thick metal foil 101 and 60 µm thick plastic film 102, which are glued together very precisely. The plastic film can be made of silicone plastic.

Metal foil 101 is stamped so that it defines a cathode and an anode. Cut-outs are stamped into the plastic film 102 over the cathode and the anode, respectively. The LED chip 1 is bonded by its underside to the cathode through one of the cut-outs. The anode is connected by a bonding wire 2 to the top side of the LED chip 1 through the other cut-out.

Figure 4:
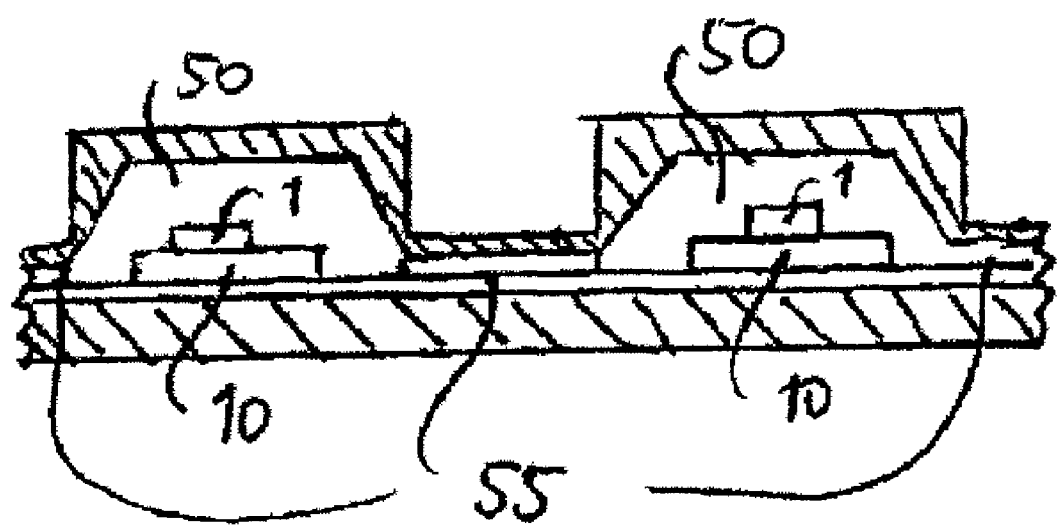
FIG. 4 is a schematic diagram showing an injection channel running between multiple exemplary components.

To be able to produce as many components as possible on the flexible frame, the encapsulation is done for example by "cavity-to-cavity molding," as shown in FIG. 4, in which a molded plastic part 5 that encapsulates the LED chip 1 and the bonding wire 2 is fabricated over each flexible leadframe 10. The number of injection channels is reduced by running an injection channel 55 through cavities 50 of the components. The molded plastic part is made of the same material as the molded plastic part of the aforesaid exemplary embodiments.

The components can also be encapsulated using an array molding process. In array molding, mold cavities each of which contains a plurality of components are filled. The overmolded components are separated, for example by sawing, after the molded parts have cooled. The surface density in array molding is advantageously greater, as a rule, than it is in cavity-to-cavity molding.

Overall, the miniature light-emitting diode has a footprint of approximately 0.5 mm×1.0 mm and a total component height of only 250 µm.

The features of the invention disclosed in the foregoing description, in the drawing and in the claims may be essential for the implementation of the invention both individually and in any combination. Instead of the light-emitting diode chip, a photodiode chip can be used, or a chip that is operated as a light-emitting diode and as a photodiode.

The invention claimed is:

1. A method of making multiple radiation-emitting and/or radiation receiving semiconductor components each comprising a radiation-emitting and/or radiation-receiving semiconductor chip, a molded plastic body which is transmissive to an electromagnetic radiation to be emitted and/or received by the semiconductor component and by which the semiconductor chip is at least partially overmolded, and external electrical leads that are electrically connected to electrical contact areas of the semiconductor chip, wherein the semiconductor chip of each component is attached to a metallic lead frame, a carrier substrate or a flexible lead frame comprising the external electrical leads, the semiconductor chip of each component, including sub-regions of the lead frame, the carrier substrate or the flexible lead frame, is placed in a respective cavity of an injection mold, and an injection channel is led through each of the multiple semiconductor components, silicone molding compound is injected into the respective cavities through the injection channel via an injection molding process or a transfer molding process, and the silicone molding compound is cured in the respective cavities at least such that in each cavity, a shape-stable molded plastic part is formed.

2. The method as in claim 1, wherein the silicone molding compound has a curing time of 10 minutes or less.

3. The method as in claim 1, wherein the semiconductor chip is attached to a flexible lead frame formed by a carrier film.

4. The method as in claim 3, further comprising forming the carrier film, wherein forming the carrier film comprises forming a laminate comprising a plastic film and a metal film.

5. The method as in claim 4, wherein forming the carrier film further comprises stamping the metal film to define a cathode and an anode for the semiconductor chip.

6. The method as in claim 5, wherein forming the carrier film further comprises stamping openings into the plastic film.

7. The method as in claim 5, wherein forming the carrier film further comprises stamping openings in the plastic film, the openings being arranged over the cathode and the anode.

8. The method as in claim 7, wherein the semiconductor chip is bonded to the cathode through one of the openings.

* * * * *